United States Patent [19]

Tanaka

[11] 4,055,784
[45] Oct. 25, 1977

[54] ELECTRON BEAM DEFLECTION CIRCUIT

[75] Inventor: Shigeo Tanaka, Ichikawa, Japan

[73] Assignee: Sony Corporation, Tokyo, Japan

[21] Appl. No.: 678,737

[22] Filed: Apr. 21, 1976

[30] Foreign Application Priority Data

Apr. 24, 1975 Japan .................................. 50-50394

[51] Int. Cl.² ......................... H01J 29/70; H01J 29/76
[52] U.S. Cl. ...................................... 315/397; 315/399
[58] Field of Search ................. 315/395, 396, 397, 399

[56] References Cited

U.S. PATENT DOCUMENTS 3,969,653   7/1976   Fukaya .................................. 315/396

Primary Examiner—Maynard R. Wilbur
Assistant Examiner—T. M. Blum
Attorney, Agent, or Firm—Lewis H. Eslinger; Alvin Sinderbrand

[57] ABSTRACT

A vertical deflection circuit for television receivers or the like which has an output stage of single-ended push-pull amplifier configuration is provided with a power supply circuit which includes a rectifying circuit connected between a D.C. voltage source and the output stage for rectifying an external A.C. voltage fed thereto to produce an additional D.C. voltage. The power supply circuit supplies a first D.C. voltage from the D.C. voltage source to the output stage during the first half of a trace or scanning period and supplies a second D.C. voltage, obtained by adding the additional D.C. voltage to the D.C. voltage from the D.C. voltage source, to the output stage during the second half of the trace or scanning period and during the retrace period.

9 Claims, 5 Drawing Figures

4,055,784

ELECTRON BEAM DEFLECTION CIRCUIT

BACKGROUND OF THE INVENTION

1. Field of the Invention

This invention generally relates to electron beam deflection circuits for a television receiver and the like, and more particularly is directed to an improvement in vertical deflection circuits of the type having an output stage in the configuration of a single-ended push-pull amplifier.

2. Description of the Prior Art

In television receivers and the like, it is necessary to deflect an electron beam in a cathode ray tube employed therein to display reproduced images thereon. To achieve the required beam deflection, various kinds of circuits have previously been proposed as vertical and horizontal deflection circuits. One of those vertical deflection circuits has an output stage, in the form of a single-ended push-pull amplifier, which supplies sawtooth wave vertical deflection current to a vertical deflection winding. Such a circuit has been often employed, usually in the form of a transistorized circuit, because it is suitable for supplying a relatively large current to a load. However, previously proposed vertical deflection circuits having the output stage in the form of a single-ended push-pull amplifier were unable to avoid a certain amount of useless power consumption which is inherent in the circuit construction and, therefore, the efficiency, namely, the ratio between the output power at the vertical deflection winding and the power supplied to the circuit, is relatively poor. Some circuits of the described type have also been proposed with the intention of providing an improvement in the power consumption, but none of them seem to have obtained fully satisfactory results.

With a sawtooth wave current circuit as a vertical deflection circuit of the single-ended push-pull amplifier type, first and second active elements or transistors are connected in series between both terminals of a power supply source and a load coil (deflection winding) is connected to the connection point between the first and second active elements. A sawtooth wave current is passed through the load winding as a result of a current which will pass through the first active element to the load winding in a first direction during the former or initial position half period of a respective input sawtooth wave signal applied to the active elements (the former half period of the retrace period of the sawtooth wave current) and a current which will pass through the second active element to the load winding in a second direction during the latter or negative half period of the respective input sawtooth wave signal (the latter half period of the retrace period of the sawtooth wave current). Accordingly, the current passed through the load winding has to be reversed in direction at every wave of the input sawtooth wave signal. In order to cause the flow through the load winding of a current whose direction is reversed at every wave of the input sawtooth wave signal as described above, it is necessary that, in such sawtooth wave current circuits a voltage which is sufficiently high with respect to one of the voltage source terminals be supplied to the other of the voltage source terminals. If it is assumed that such voltage which sufficiently high, as described above, is always supplied to one of the voltage source terminals, the power consumption, which is the product of the current flowing through the first active element during the former a positive half period of each wave of the input sawtooth wave signal and such high voltage, becomes relatively high.

In the described sawtooth wave current circuit, the sufficiently high voltage, which is required to be applied to one of the voltage source terminals as mentioned above, is to ensure that a current whose direction is reversed at every wave of the input sawtooth wave signal will be passed through the load winding. Therefore, it is enough that the sufficiently high voltage is obtained only at the transition from one wave of the input sawtooth wave signal to the following wave thereof (that is, during the retrace period of the sawtooth wave current). Accordingly, the relatively large power consumed by the first active element during the former or positive half period of each wave of the input sawtooth wave signal is wasted or has no useful purpose. Therefore, it will be seen that, if one of the voltage source terminals is supplied with a relatively low voltage during the former or positive half period of each wave of the input of the input sawtooth wave signal and with the above mentioned sufficiently high voltage only during the latter or negative half period thereof, the consumed power is reduced and hence the efficiency can be improved as a whole.

SUMMARY OF THE INVENTION

It is an object of the present invention to provide an improved vertical deflection circuit having an output stage in the form of a single-ended push-pull amplifier.

Another object of the present invention is to provide a vertical deflection circuit having an output stage in the form of a single-ended push-pull amplifier and which is operative with increased efficiency.

The present invention provides a novel vertical deflection circuit having an output stage in the form of a single-ended push-pull amplifier which operates with a first D.C. operating voltage supplied from a voltage source during the first half of a trace or scanning period of a deflection current and with a second D.C. operating voltage is higher than the first D.C. operation voltage and which gradually increases from the middle to the end of the trace period, that is, during the second half of the trace period and during a retrace period of the deflection current, so that the efficiency is increased. The circuit according to the invention includes an operation voltage supplying circuit in which the second D.C. operating voltage is obtained by adding to the first D.C. operating voltage an additional D.C. voltage resulting from rectifying of an externally supplied A.C. voltage and which gradually increases.

The above, and other objects, features and advantages of the present invention will become apparent from the following description taken in conjunction with the accompanying drawings.

DESCRIPTION OF THE PREFERRED EMBODIMENT

Figure 1:
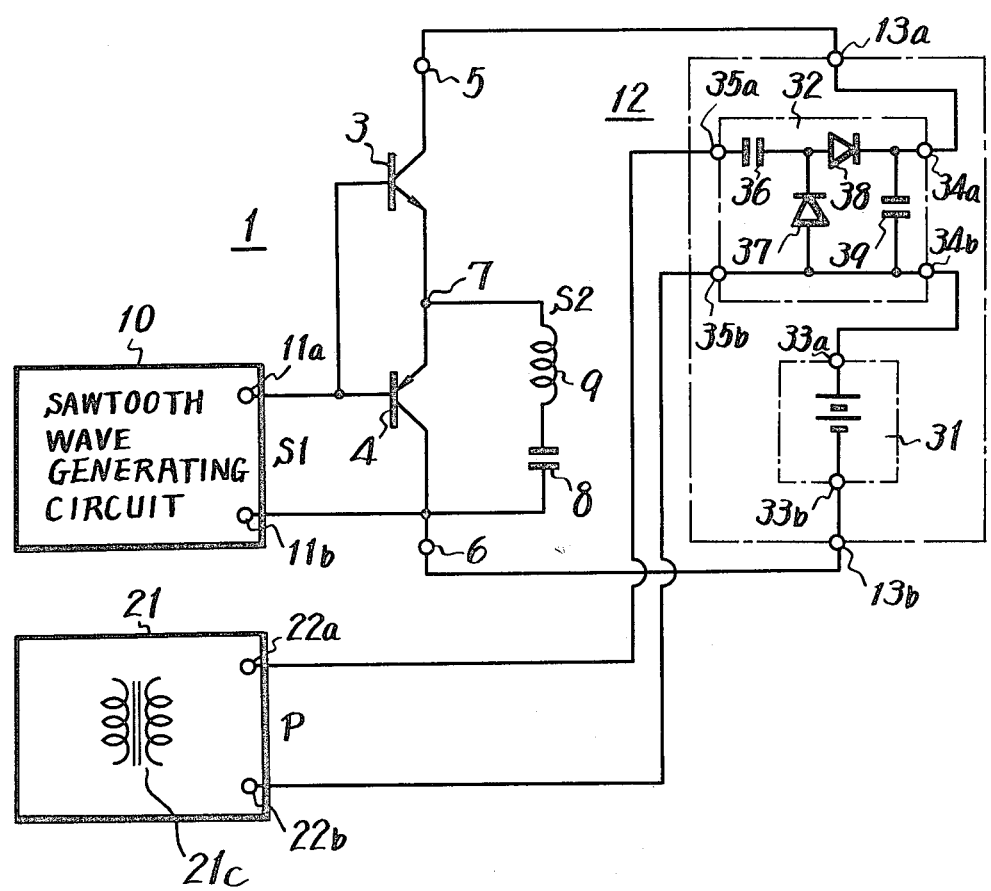
FIG. 1 is a schematic circuit diagram showing one embodiment of a vertical deflection circuit according to the present invention.

An embodiment of the vertical deflection circuit for a television receiver according to the present invention will now be described in detail with reference to FIG. 1 of the drawings.

It will be seen that the illustrated vertical deflection circuit 1 includes a transistor 3 of an NPN type and a transistor 4 of a PNP type as active elements. The emitter electrodes of the transistors 3 and 4 are connected together at a connection point 7, and the collector electrodes of the transistors 3 and 4 are connected to terminals 5 and 6 to which a DC voltage source circuit 12 is connected. Thus, the transistors 3 and 4 provide an output stage in the form of a single-ended push-pull amplifier. The connection point 7 between the transistors 3 and 4 is connected to the terminal 6 through a series connection of a vertical deflection winding or coil 9, which serves as a load winding, and a capacitor 8. The base electrodes of the transistors 3 and 4 are connected together to one of the output terminals 11a and 11b, for example, the terminal 11a, as shown of a sawtooth wave signal generator 10 which will produce an input sawtooth wave signal S1 in synchronism with the vertical synchronizing signal. The other output terminal 11b of the sawtooth wave signal generator 10 is connected to the terminal 6. The terminals 5 and 6 are respectively connected to output terminals 13a and 13b of the D.C. voltage source circuit 12.

The operation of the above described circuit is substantially the same as that of existing vertical deflections circuits so that its detailed description will be omitted.

Figure 2A:
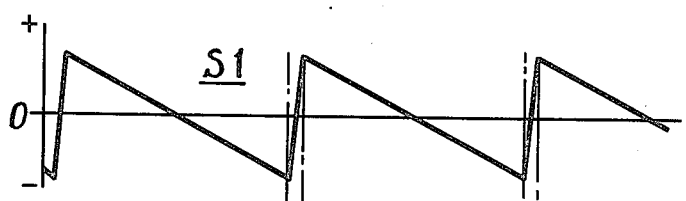
FIGS. 2A to 2D, inclusive, are schematic waveforms used for explaining the operation of the circuit shown in FIG. 1.
Figure 2B:
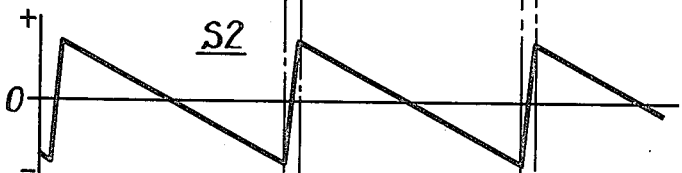

If it is assumed that a predetermined D.C. voltage is constantly obtained between the output terminals 13a and 13b of the voltage source circuit 12, and hence is applied between the terminals 5 and 6, and the sawtooth wave signal generator 10 produces an input sawtooth wave signal S1 with a waveform shown in FIG. 2A, the transistor 3 is made conductive during the positive period of each wave of the input sawtooth wave signal S1 and the transistor 4 becomes non-conductive during the same period. Thus, a current flows through the vertical deflection coil 9 and through the capacitor 8 in the direction from the connection point 7 to the terminal 6. On the other hand, during the negative period of each wave of the input sawtooth wave signal S1, the transistor 3 becomes non-conductive but the transistor 4 becomes conductive, so that a current flows from the capacitor 8 through the coil 9, the connection point 7, the transistor 4 and the terminal 6 back to the capacitor 8 as a result of the charge stored in the capacitor 8 during the positive period of each wave of the input sawtooth signal S1. Thus, a sawtooth wave current S2 shown in FIG. 2B passes through the coil 9.

Figure 2C:
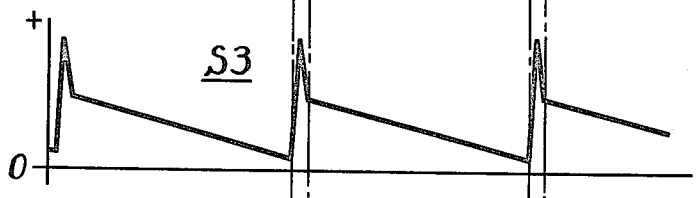

FIG. 2C shows generally a voltage waveform S3 representing the voltage at the connection point 7 relative to that at the terminal 6.

Referring again to FIG. 1, it will be seen that the reference numeral 21 generally designates a horizontal deflection circuit which includes a fly-back transformer 21c. Although the detailed description of the conventional horizontal deflection circuit 21 will be omitted, this circuit is shown to have a pair of output terminals 22a and 22b between which a pulse P is produced in synchonism with the horizontal synchronizng signal.

In accordance with the present invention, the D.C. voltage source circuit 12 is shown to generally comprise a D.C. voltage source 31, such as a battery, and a rectifying circuit 32 which is supplied across its pair of input terminals 35a and 35b with the pulse P from the output terminals 22a and 22b of the horizontal deflection circuit 21 and then which rectifies the pulse P. The D.C. voltage source circuit 12 thus produces, between its output terminals 13a and 13b and hence between the terminals 5 and 6, a D.C. voltage $V_C'$ based upon a D.C. voltage $V_C$ obtained from the D.C. voltage source 31, which voltage $V_C'$ is of substantially the same value as voltage $V_C$ during the former or first half period of each wave of the input sawtooth wave signal S1, and a D.C. voltage $(V_C' + V_R')$ based upon the D.C. voltage $V_C$ obtained from the DC voltage source 31 and an output D.C. voltage $V_R$ obtained from the rectifying circuit 32, which voltage $(V_C' + V_R')$ is of substantially the same value as the sum of the voltages $(V_C + V_R)$, during the latter or second half period of each wave of the input sawtooth wave signal S1. To this end, one of output terminals 33a and 33b of the D.C. voltage source 31, for example, the output terminal 33b at the negative side of the D.C. voltage source 31 is connected to the output terminal 13b of the volage source circuit 12 and accordingly to the terminal 6, and the output terminal 33a at the positive side of the D.C. voltage source 31 is connected to one of the output terminals 34a and 34b of the rectifying circuit 32, for example, to the output terminal 34b at the negative side thereof, as shown. The pulse P from the horizontal deflection circuit 21 is supplied across the input terminal 35a and 35b of the rectifying circuit 32 with the terminal 35a being positive. A capacitor 36 and a diode 37 are connected in series between the input terminals 35a and 35b of the rectifying circuit 32 in such a manner that the free end of the capacitor 36 is connected to the terminal 35a and the anode electrode of the diode 37 is connected to the terminal 35b. A series connecton of a diode 38 and a capacitor 39 is connected in parallel to the diode 37 in such a manner that the anode electrode of the diode 38 is connected to the cathode electrode of the diode 37 and the free end of the capacitor 39 is connected to the anode electrode of the diode 37. The opposite ends of the capacitor 39 are connected to the output terminals 34a and 34b, respectively, of the rectifying circuit 32. Thus, the rectifying circuit 32 formed of the capacitors 36, 39 and the diodes 37, 38 is of the double voltage-rectifying type. The output terminal 34a of the rectifying circuit 32 is connected to the output terminal 13a of the voltage source circuit 12 and accordingly to the terminal 5.

In the above described voltage source circuit 12 of a vertical deflection circuit according to this invention, the series connection of the diodes 37 and 38, which are connected in the same directon, is connected in parallel to the capacitor 39 of the rectifying circuit 32 and the cathode electrode of the diode 38 is connected to the output terminal 34a of the rectifying circuit 32 and accordngly to the output terminal 13a of the voltage source circuit 12. Therefore, when the transistor 3 is made conductive during the positive period of each of the input sawtooth wave signal S1 as described above, both of the diodes 37 and 38 of the rectifying circuit 32 become conductive to short-circuit the capacitor 39. As a result, across the terminals 5 and 6 there is supplied only the D.C. voltage $V_C'$ which is substantially the same as the voltage $V_C$ obtained between the output terminals 33a and 33b of the D.C. voltage source 31. On the other hand, when the transistor 3 becomes nonconductive during the negative period of each wave of the input sawtooth wave signal S1, the diodes 37 and 38 of the rectifying circuit 32 do not become conductive and act as rectifying diodes. Accordingly, between the ends of the capacitor 39, and hence between the output terminals 34a and 34b of the rectifying circuit 32, there is obtained the voltage $V_R$ which increases gradually with time during each negative period of the input signal S1. Accordingly, the voltage ($V_C' + V_R'$), which is substantially the same as the sum of the voltage $V_R$ and of the voltage $V_C$ obtained between the output terminals 33a and 33b of the voltage source 31, is applied between the terminals 5 and 6.

Figure 2D:
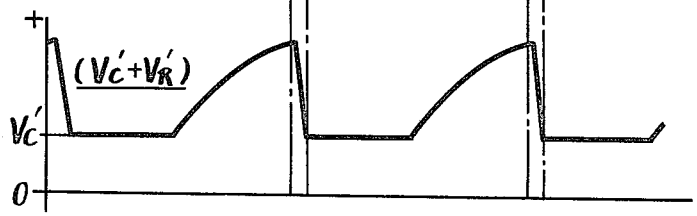

Therefore, with the circuit according to the invention, as described as above, between the terminals 5 and 6 there are applied the D.C. voltage $V_C'$ during the former or positive half period of each wave of the input sawtooth signal S1 and the D.C. voltage ($V_C' + V_R'$) during the latter or negative half period thereof, as shown in FIG. 2D. It will be noted that, at the transition from one wave to the following wave of the input sawtooth wave signal S1, that is, during the retrace period of the sawtooth wave current S2 passing through coil 9, the voltage $V_R$ obtained between the output terminals 34a and 34b of the rectifying circuit 32 becomes maximum. Therefore, the voltage ($V_C' + V_R'$) which is obtained during each negative period of S1 is the sufficiently high voltage mentioned previously as being required. Thus, with the terminal 6 taken as a reference, at the transition from one wave to the following wave of the input sawtooth wave signal S1 (that is, during the initial portion of the retrace period of the sawtooth wave current S2), the terminal 5 is supplied with a voltage which is sufficiently higher than the voltage applied thereto during at least the former or positive half period of each wave of the input sawtooth wave signal S1, that is, the concluding portion of the retrace period of the sawtooth wave current S2. As a result, a sawtooth wave signal S1, can be positively passed through the coil 9.

Further, with the circuit of the invention, the terminal 5 is supplied with only the voltage $V_C'$ which is substantially the same as the voltage $V_C$ from the DC voltage source 31 and lower than the voltage ($V_C' + V_R'$) during the former or positie half period of each wave of the input sawtooth wave signal S1 within which period the transistor 3 is made conductive, so that the power consumption, which is the product of the current flowing through the transistor 3 and the voltage applied to the terminal 5, can be produced. Moreover, even though the terminal 5 is supplied with the voltage ($V_C' + V_R'$) higher than the voltage $V_C'$ during the latter or negative half period of each wave of the input sawtooth wave signal S1 corresponding to the latter half of the trace period of the sawtooth wave current S2, since the transistor 3 is non-conductive during this period, no substantial power consumption occurs. Therefore, with the circuit according to the invention the sawtooth wave current $S_2$, which is the vertical deflection current, can be passed through the coil 9 with less power consumption.

Further, the voltage supply circuit 12 of according to the invention, which will supply to the terminal 5 the relatively low voltage $V_C'$ during the former half period of each wave of the input sawtooth wave signal S1 and the relatively high voltage ($V_C' + V_R'$) during the latter half period of each wave of theinput sawtooth wave signal S1, and especially at the transition from one wave to the following wave of the input sawtooth wave signal S1 is formed of the DC voltage source 31 and the rectifying circuit 32 including the diodes 37 and 38 connected in series to the source 31, so that the voltage supply circuit 12 is simple in construction.

Since the pulse P obtained from the horizontal deflection circuits 21 is used as the input signal to the rectifying circuit 32, there is no need to provide a separate or additional circuit for producing the input signal to the rectifying circuit 32.

The above described circuit according to the invention, NPN and PNP type transistors are employed as the active elements, respectively, but it will be apparent that two transistors of the same type, namely, NPN or PNP type transistors, can be employed, in which case the base electrodes of the two transistors of the same type are supplied with input sawtooth wave signals which are reversed in phase so as to make such transistors conductive alternately.

Further, in the above embodiment of the invention the rectifying circuit 32 of the voltage supply circuit 12 is a double voltage rectifying circuit, but it will be understood that any other multiple voltage rectifying circuit can be employed in place of the double voltage rectifying circuit 32.

It will also be realized that the present invention can be applied not only to the vertical deflection circuit of a television receiver but also to other sawtooth wave current circuits. In the latter case, the rectifying circuit 32 is supplied with an A.C. input signal whose period is sufficiently shorter than that of the input sawtooth wave signal so as to permit the circuit 32 to rectify the A.C. signal.

It will be apparent that many modifications and variations can be effected in the above described and illustrated embodiment of the invention by one skilled in the art without departing from the spirits or scope of the novel concepts of the present invention, so that the scope of the invention should be determined by the appended claims only.

I claim as my invention:

1. A vertical deflection circuit comprising:
   an output circuit including first and second transistors connected to form a single-ended push-pull amplifiers having an output, an operating voltage terminal connected to said first transistor and adopted to receive an operating voltage for said transistors, a vertical deflection coil connected to said output of the single-ended push-pull amplifier, and means for applying sawtooth wave input signals to said amplifier so as to cause sawtooth wave currents to flow in said vertical deflection coil; and
   a power supply circuit for supplying said operating voltage to said terminal including D.C. voltage source means for supplying a substantially constant D.C. voltage, A.C. voltage source means for supplying an A.C. voltage, and rectifier means connected with said D.C. and A.C. voltage source means for rectifying said A.C. voltage and producing an additional D.C. voltage which is added to said constant D.C. voltage only during a predetermined portion of each wave of said sawtooth wave input signals for causing the power supply circuit to provide a resulting first operating voltage at said terminal during only said predetermined portion of each wave of the input signals, said rectifier means being inoperative to rectify said A.C. voltage for causing the power supply circuit to apply to said terminal a second operating voltage corresponding substantially to said constant D.C. voltage during the remaining portion of each wave of said sawtooth wave input signals.

2. A vertical deflection circuit according to claim 1; in which said first operating voltage has an absolute voltage value which is substantially higher than that of said second operating voltage.

3. A vertical deflection circuit according to claim 1; in which said first and second transistors are alternately conductive during the first and second halves, respectively, of each wave of the sawtooth wave input signals; and in which said rectifier means is operative to provide said first operating voltage to said terminal only during said second half of each wave when said first transistor is in its non-conductive condition, and said rectifier means transmits only said constant D.C. voltage as said second operating voltage to said terminal during said first half of each wave when said first transistor is in its conductive condition.

4. A vertical deflection circuit according to claim 3; in which said rectifier means is connected with said operating voltage terminal so as to be controlled by the condition of said first transistor connected with said terminal.

5. A vertical deflection circuit according to claim 4; in which said rectifier means includes means for causing said additional D.C. voltage resulting from the rectifying of said A.C. voltage to increase gradually during said second half of each wave of the sawtooth wave input signals.

6. A vertical deflection circuit according to claim 1; in which said rectifier means is also connected with said operating voltage terminal for transmitting said constant D.C. voltage through said rectifier means to said terminal during said remaining portion of each wave of the sawtooth wave input signal when said rectifier means is inoperative to rectify said A.C. voltage.

7. A vertical deflection circuit according to claim 6; in which said A.C. voltage source means includes a horizontal pulse generating circuit.

8. A vertical deflection circuit according to claim 7; in which said horizontal pulse generating circuit includes a horizontal deflection circuit provided with a flyback transformer.

9. A vertical deflection circuit according to claim 1; in which said rectifier mans includes first and second input terminals between which said A.C. voltage is applied, a first output terminal connected to said operating voltage terminal, a second output terminal receiving said constant D.C. voltage, first and second diodes connected in series between said first and second output terminals and being polarized to conduct in the direction from said second output terminal to said first output terminal, a first capacitor connected between said first input terminal and a junction between said diodes, and a second capacitor connected between said first and second output terminals in parallel with said diodes.

* * * * *